United States Patent
Loscutoff et al.

(10) Patent No.: US 8,992,803 B2
(45) Date of Patent: Mar. 31, 2015

(54) DOPANT INK COMPOSITION AND METHOD OF FABRICATING A SOLAR CELL THERE FROM

(75) Inventors: Paul Loscutoff, Castro Valley, CA (US); Kahn Wu, San Francisco, CA (US); Steven Edward Molesa, San Jose, CA (US)

(73) Assignee: SunPower Corporation, San Jose, CA (US)

( * ) Notice: Subject to any disclaimer, the term of this patent is extended or adjusted under 35 U.S.C. 154(b) by 300 days.

(21) Appl. No.: 13/250,215

(22) Filed: Sep. 30, 2011

(65) Prior Publication Data

US 2013/0081677 A1    Apr. 4, 2013

(51) Int. Cl.
*H01B 1/06* (2006.01)
*H01L 21/02* (2006.01)
*H01L 31/0525* (2014.01)
(Continued)

(52) U.S. Cl.
CPC .......... *H01L 31/058* (2013.01); *H01L 31/0682* (2013.01); *H01L 31/1804* (2013.01); *Y02E 10/60* (2013.01); *Y02E 10/547* (2013.01)
USPC .......................... 252/518.1; 252/521.5; 428/32

(58) Field of Classification Search
CPC .............. H01B 1/00; H01B 1/06; H01B 1/08; H01B 1/14; H01L 21/02576; H01L 21/02579; H01L 21/02581; H01L 21/02628; H01L 21/02601; H01L 31/042; H01L 31/18; C09D 11/02; C09D 11/38; C09D 11/52
USPC .................. 428/32.26; 703/45; 252/512–514, 252/518.1, 521.4, 521.5
See application file for complete search history.

(56) References Cited

U.S. PATENT DOCUMENTS

| | | | |
|---|---|---|---|
| 4,473,523 | A | 9/1984 | Sasaki et al. |
| 4,927,770 | A | 5/1990 | Swanson |

(Continued)

FOREIGN PATENT DOCUMENTS

| | | |
|---|---|---|
| JP | 2007134655 | 5/2007 |
| KR | 20070106818 | 11/2007 |

(Continued)

OTHER PUBLICATIONS

Soltman et al., "Inkjet-Printed Line Morphologies and Temperature Control of the Coffee Ring Effect," American Chemical Society, 2008, vol. 24, No. 5, pp. 2224-2231 (published on Web Jan. 16, 2008).

(Continued)

*Primary Examiner* — Mark Kopec
(74) *Attorney, Agent, or Firm* — Blakely Sokoloff Taylor Zafman LLP

(57) ABSTRACT

Dopant ink compositions and methods of fabricating solar cells there from are described. A dopant ink composition may include a cross-linkable matrix precursor, a bound dopant species, and a solvent. A method of fabricating a solar cell may include delivering a dopant ink composition to a region above a substrate. The dopant ink composition includes a cross-linkable matrix precursor, a bound dopant species, and a solvent. The method also includes baking the dopant ink composition to remove a substantial portion of the solvent of the dopant ink composition, curing the baked dopant ink composition to cross-link a substantial portion of the cross-linkable matrix precursor of the dopant ink composition, and driving dopants from the cured dopant ink composition toward the substrate.

7 Claims, 5 Drawing Sheets

(51) Int. Cl.
*H01L 31/068* (2012.01)
*H01L 31/18* (2006.01)

(56) References Cited

U.S. PATENT DOCUMENTS

| | | | |
|---|---|---|---|
| 5,030,295 A | 7/1991 | Swanson et al. | |
| 5,053,083 A | 10/1991 | Sinton | |
| 5,057,439 A | 10/1991 | Swanson et al. | |
| 5,747,381 A | 5/1998 | Wu et al. | |
| 7,709,307 B2 | 5/2010 | Kamath et al. | |
| 7,767,520 B2 | 8/2010 | Kamath et al. | |
| 7,901,656 B2 * | 3/2011 | Winter et al. | 423/592.1 |
| 7,977,240 B1 | 7/2011 | Rockenberger et al. | |
| 8,399,878 B2 * | 3/2013 | Hieslmair et al. | 257/19 |
| 8,426,905 B2 * | 4/2013 | Kamath et al. | 257/321 |
| 2006/0094189 A1 | 5/2006 | Zurcher et al. | |
| 2007/0095445 A1 | 5/2007 | Gangopadhyay et al. | |
| 2008/0035198 A1 | 2/2008 | Teppe et al. | |
| 2009/0239363 A1 * | 9/2009 | Leung et al. | 438/562 |
| 2009/0286393 A1 | 11/2009 | Mathew et al. | |
| 2009/0301549 A1 | 12/2009 | Moslehi | |
| 2010/0081264 A1 | 4/2010 | Leung et al. | |
| 2010/0084729 A1 | 4/2010 | Steinbrueck et al. | |
| 2010/0099236 A1 | 4/2010 | Kwon et al. | |
| 2011/0003424 A1 | 1/2011 | De Ceuster et al. | |
| 2011/0021012 A1 | 1/2011 | Leung et al. | |
| 2011/0070681 A1 | 3/2011 | Nakayashiki et al. | |
| 2011/0318939 A1 | 12/2011 | Shimoda et al. | |
| 2013/0081680 A1 | 4/2013 | Molesa et al. | |
| 2013/0081687 A1 | 4/2013 | Wu et al. | |
| 2013/0098266 A1 * | 4/2013 | Zhou et al. | 106/31.13 |

FOREIGN PATENT DOCUMENTS

| | | |
|---|---|---|
| KR | 10-2011-0101141 | 9/2011 |
| WO | WO-2008141415 | 11/2008 |
| WO | WO-2009-152146 | 12/2009 |
| WO | WO-2009/152146 | 12/2009 |
| WO | 2010/079842 | 7/2010 |

OTHER PUBLICATIONS

Molesa et al., "High-quality inkjet-printed multilevel interconnects and inductive components on plastic for ultra-low-cost RFID applications," Materials Research Society Symposium Proceedings, 2003, pp. H8.3.1-H8.3.6.

International Search Report and Written Opinion from PCT/US2012/057349 mailed Mar. 27, 2013, 9 pgs.

International Search Report and Written Opinion from PCT/US2012/057350 mailed Mar. 25, 2013, 13 pgs.

International Search Report and Written Opinion for PCT Patent Application No. PCT/US2012/057348 mailed Jul. 24, 2013, 12 pgs.

Non-Final Office Action for U.S. Appl. No. 13/250,594 mailed Feb. 13, 2013, 17 pgs.

Notice of Allowance and Fees for U.S. Appl. No. 13/250,594 mailed Jul. 15, 2013, 11 pgs.

"International Preliminary Report on Patentability dated Apr. 1, 2014, in International Patent Application No. PCT/US2012/057348, 9 pages".

"International Preliminary Report on Patentability dated Apr. 1, 2014, in International Patent Application No. PCT/US2012/057349, 7 pages".

"International Preliminary Report on Patentability dated Apr. 1, 2014, in International Patent Application No. PCT/US2012/057350, 9 pages".

* cited by examiner

DOPANT INK COMPOSITION AND METHOD OF FABRICATING A SOLAR CELL THERE FROM

The invention described herein was made with Governmental support under contract number DE-FC36-07GO17043 awarded by the United States Department of Energy. The Government may have certain rights in the invention.

TECHNICAL FIELD

Embodiments of the present invention are in the field of renewable energy and, in particular, dopant ink compositions and methods of fabricating solar cells there from.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Embodiments of the present invention allow for increased solar cell manufacture efficiency by providing novel processes for fabricating solar cell structures.

DETAILED DESCRIPTION

Figure 1A:
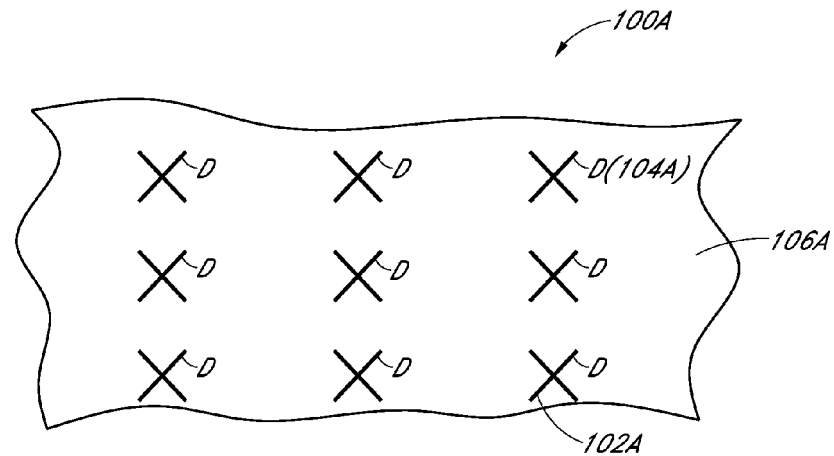
FIG. 1A is a schematic diagram of a dopant ink composition, in accordance with an embodiment of the present invention.

Dopant ink compositions and methods of fabricating solar cells are described herein. In the following description, numerous specific details are set forth, such as specific process flow operations, in order to provide a thorough understanding of embodiments of the present invention. It will be apparent to one skilled in the art that embodiments of the present invention may be practiced without these specific details. In other instances, well-known fabrication techniques, such as metal contact formation techniques, are not described in detail in order to not unnecessarily obscure embodiments of the present invention. Furthermore, it is to be understood that the various embodiments shown in the figures are illustrative representations and are not necessarily drawn to scale.

Disclosed herein are dopant ink compositions. In one embodiment, a dopant ink composition includes a cross-linkable matrix precursor, a bound dopant species, and a solvent. In another embodiment, a dopant ink composition includes a cross-linkable matrix precursor, a plurality of particles, a dopant species coupled to one of the particles, and a solvent.

Also disclosed herein are methods of fabricating solar cells. In one embodiment, a method includes delivering a dopant ink composition to a region above a substrate, baking the dopant ink composition to remove a substantial portion of a solvent of the dopant ink composition, curing the baked dopant ink composition to cross-link a substantial portion of a cross-linkable matrix precursor of the dopant ink composition, and driving dopants from the cured dopant ink composition toward the substrate.

Dopant inks enable use of liquid deposition methods in solar cell fabrication (and, perhaps, more generally semiconductor structure fabrication) as a route to selectively doping a substrate. Such liquid deposition methods may offer reduced cost relative to typical vapor-phase dopant deposition techniques, which typically involve expensive furnaces and vacuum chambers in addition to toxic gas delivery and exhaust systems. While dopant inks may be desirable for cost reduction, they often out-gas the dopant or dopant precursor included therein over a wide temperature range, even as low as 50 degrees Celsius and up to diffusion temperatures around 1000 degrees Celsius or higher. The dopant or dopant precursor out-gassing may lead to difficulty in achieving precise control of a resulting diffusion profile, and may lead to unintended doping of certain regions of the substrate, e.g., in the form of counter-doping or auto-doping.

For effective implementation of a suitable dopant ink in a solar cell manufacturing process, tight temperature control has typically been required. Such control of the process has been achieved by laborious precise tooling and significant recipe tuning. Furthermore, increasing gas flow or pulling a vacuum during thermal operations may have to be implemented. The above measures usually come with increased tool requirements and cost. Additional approaches to address or mitigate out-gassing from dopant inks include capping the dopant ink with another material, such as an oxide material, a nitride material, or amorphous silicon. However, the capping approaches require at least one additional operation in a process flow and often further involve increased tool and material costs. Also, the cap layer may need to be removed in subsequent processing, furthering again the costs involved. Another consideration for dopant inks comes in a need for efficiency when both types of dopants, e.g. n-type and p-type, are needed in different regions of a receiving substrate.

In accordance with one or more embodiments of the present invention, issues associated with out-gassing of dopants or dopant precursors from dopant inks are addressed. In one such embodiment, an approach for design of dopant ink formulations which reduces dopant out-gassing by integrating a dopant or a dopant precursor into a bound state in the matrix of the ink is provided. For example, in a specific embodiment, a dopant ink includes a siloxane support matrix, such as is often included in common spin-on glass (SOG) materials. The dopant ink has siloxane monomers, which undergo a cross-linking reaction at elevated temperature or with ultraviolet (UV) light to form a silicon oxide matrix. Also included in the dopant ink is the bound dopant or dopant precursor, which may be included as such in several different manners, described in more detail below.

In a first such embodiment, the bound dopant or dopant precursor is chemically bonded to a siloxane backbone during siloxane synthesis. This approach may increases the molecular weight of a support molecule including a dopant, thus decreasing the vapor pressure and thereby the dopant out-gassing. Additionally, as the temperature is increased to promote the siloxane cross-linking reaction, the dopant-siloxane molecule may become tethered within the matrix. Once the cross-linking reaction takes place, the dopant may remain bound to the matrix until a temperature is reached sufficient to break the chemical bond of the dopant atom from the siloxane backbone. In one embodiment, the siloxane cross-linking reaction kinetics are altered to favor higher or lower temperatures by modifying the terminal groups of the siloxane. The resulting siloxane matrix densifies to form a silicon oxide matrix, which may provide a greater ability to bind dopant atoms than the siloxane solution of the ink. Thus, by tailoring the reactivity of the siloxanes, a two-stage dopant retention mechanism may be established. Namely, the dopant is retained at lower temperatures likely due to the chemical binding of the dopant atom to the siloxane backbone, and the dopant is retained at higher temperatures likely due to the binding of the dopant atom within the resulting silicon oxide matrix.

In a second such embodiment, the bound dopant or dopant precursor is incorporated within a particle, such as a nanoparticle, blended in a suspension with the siloxane monomers. Such particles may include silicon oxide based nanoparticles or silicon nanoparticles. By binding the dopant atom within a solid, the diffusion coefficient of the dopant atom may be reduced as compared to the dopant remaining in solution, e.g., an essentially free form counterpart. The effect may be particularly pronounced at lower temperatures, e.g., during a bake process, an organic burnout process, or initial start of a temperature ramp toward a diffusion temperature. The siloxane matrix may densify at elevated temperatures to form a silicon oxide matrix, which provides a greater ability to bind dopant atoms than the siloxane solution of the ink. In the case of a suspension of nanoparticles within a siloxane monomer liquid phase, a two-stage dopant retention mechanism may be provided. Namely, the dopant is retained at lower temperatures likely due to the binding of the dopant atom within the solid-phase nanoparticle, and the dopant is retained at higher temperatures likely by way of the additional binding created by the nanoparticles residing within the silicon oxide matrix.

Embodiments of the present invention may be implemented in a variety of solar cell technology platforms. In one embodiment, a dopant ink composition is used as either a p-type or n-type dopant source. In another embodiment, a dopant ink composition is used as one or both of the p-type and n-type dopant sources.

Figure 1B:
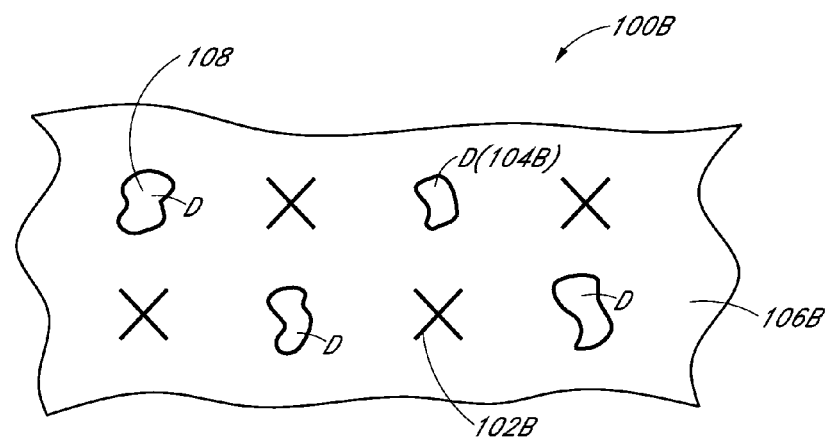
FIG. 1B is a schematic diagram of a dopant ink composition, in accordance with another embodiment of the present invention.

In an aspect of the present invention, a dopant ink composition is suitable for, upon depositing on a substrate or layer, delivering charge carrier dopant atoms, e.g., for fabrication of a solar cell. FIGS. 1A and 1B are schematic diagrams of dopant ink compositions, in accordance with an embodiment of the present invention.

Referring to FIGS. 1A and 1B, dopant ink compositions 100A and 100B, respectively, each include a cross-linkable matrix precursor (designated as X) 102A and 102B, respectively. Bound dopant species (designated as D) 104A and 104B, respectively, are also included. The cross-linkable matrix precursors 102A and 102B and the bound dopant species 104A and 104B are included in solvents 106A and 106B, respectively.

Referring only to FIG. 1A, in an embodiment, the bound dopant species 104A is bound to the cross-linkable matrix precursor 102A. For example, in one embodiment, the bound dopant species 104A is a dopant precursor bound to the cross-linkable matrix precursor through a chemical bond. The chemical bond may be one in which electrons are shared or donated between an atom of the bound dopant species 104A and an atom of the cross-linkable matrix precursor 102A. In a specific such embodiment, the chemical bond is one such as, but not limited to, a covalent bond, an ionic bond, or a dative bond. However, strictly electrostatic interactions, such as Van der Waals interactions, may not be considered in the definition of a chemical bond.

Figure 2A:
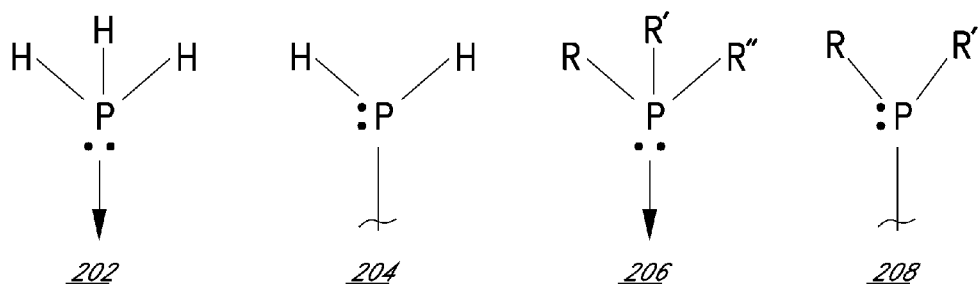
FIG. 2A includes chemical representations of phosphine moieties and organophosphine moieties for dopant ink compositions, in accordance with an embodiment of the present invention.
Figure 2B:
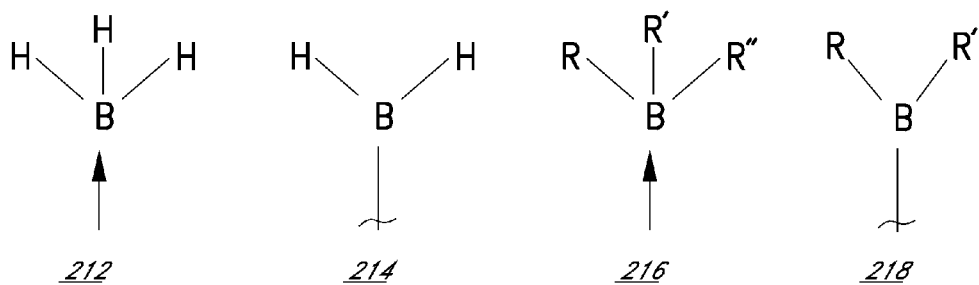
FIG. 2B includes chemical representations of borane moieties and organoborane moieties for dopant ink compositions, in accordance with an embodiment of the present invention.

In an embodiment, referring again to FIG. 1A, the bound dopant species 104A is an n-type dopant precursor such as, but not limited to, a phosphine moiety (e.g., 202 and 204 of FIG. 2A) or an organophosphine moiety (e.g., 206 and 208 of FIG. 2A, where R, R' and R" are organic groups). It is to be understood that although only moieties with oxidation state III for phosphorus are shown for the n-type dopant precursor, moieties with oxidation state V for phosphorus are also contemplated. In another embodiment, the bound dopant species 104A is a p-type dopant precursor such as, but not limited to, a borane moiety (e.g., 212 and 214 of FIG. 2B) or an organoborane moiety (e.g., 216 and 218 of FIG. 2B, where R, R' and R" are organic groups).

Referring only to FIG. 1B, in an embodiment, the dopant ink composition 100B further includes a plurality of particles 108. The bound dopant species 104B is bound to one or more of the particles 108. The particles 108 may be, or may be formed from, material species such as, but not limited to, nanoparticles, flakes, strands, or macromolecules such as proteins, or large organic molecules. In one embodiment, the average size of each of the particles 108 is in the nanometer to micron range, e.g., as measured as a diameter of the particle.

In an embodiment, referring again to FIG. 1B, the bound dopant species 104B is an n-type or a p-type dopant precursor bound to a surface of one of the particles through a chemical bond. Such an arrangement may be similar to the chemical bonding described in association with FIG. 1A and may include moieties such as those described above in association with FIGS. 2A and 2B. In such embodiments, the bound dopant species 104B may also be described as being tethered to the particles 108. As an alternative embodiment, however, the bound dopant species 104B may be an n-type or a p-type dopant atom (e.g., such as a boron or phosphorous atom) incorporated into one of the particles 108 as an actual component of the particle 108. In such embodiments, the dopant atoms may be chemically bonded to other atoms in the particles 108, or may be electrostatically trapped by other atoms in the particles 108, e.g., as caged or cryptand-bound dopant atoms.

In an embodiment, the cross-linkable matrix precursor 102A or 102B is one that is thermally cross-linkable such as, but not limited to, a siloxane species, a silane species, or a cyclosilane species. In an embodiment, the solvent 106A or 106B is an organic solvent, such as but not limited to, an alkyl-based alcohol (e.g., ethanol or propanol), an aryl-based alcohol (e.g., phenol), decalin, an alkane (e.g., hexanes, cyclohexanes, octanes), an aromatic (e.g., toluene or other benzene-derivatives) an ethyl acetate species (e.g., propylene glycol methyl ethyl acetate (PGMEA)). However, in another embodiment, the solvent 106A or 106B is aqueous-based and includes water (e.g., small silane species or small siloxane species as cross-linkable matrix precursors may be compatible with aqueous-based solvents). In an embodiment, the cross-linkable matrix precursor 102A or 102B is dissolved in the solvent 106A or 106B.

Figure 3:
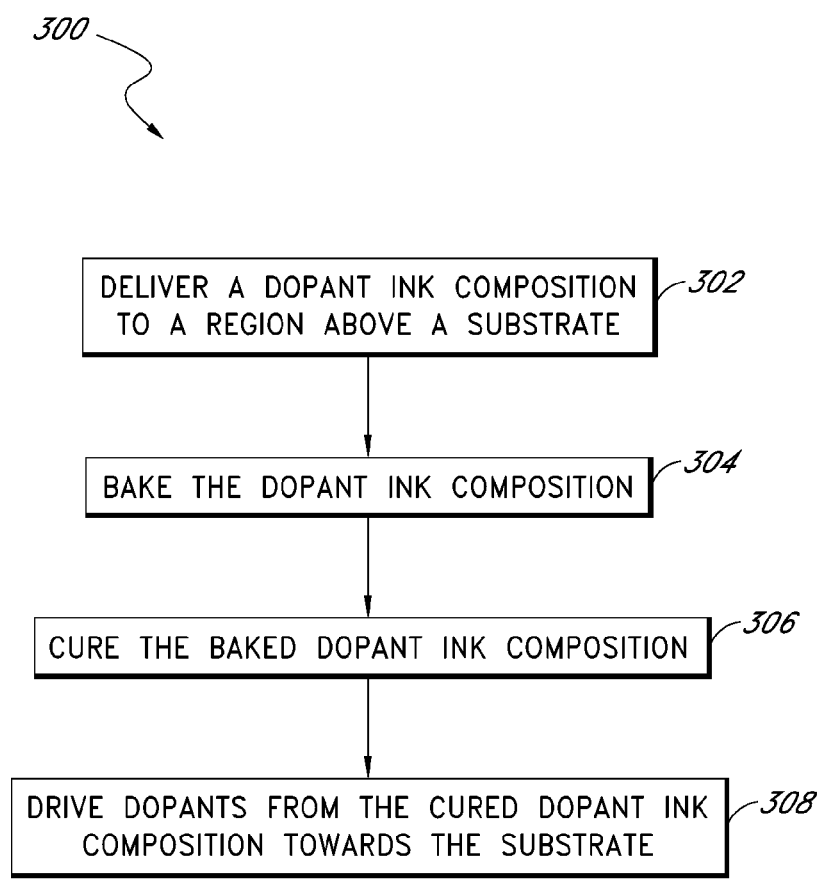
FIG. 3 is a flowchart representing operations in a method of fabricating a solar cell, in accordance with an embodiment of the present invention.

In another aspect of the present invention, a solar cell may be fabricated by forming doped regions with a dopant ink composition. For example, FIG. 3 is a flowchart 300 representing operations in a method of fabricating a solar cell, in accordance with an embodiment of the present invention. FIGS. 4A-4D illustrate cross-sectional views of various stages in the fabrication of a solar cell, corresponding to operations of flowchart 300, in accordance with an embodiment of the present invention.

Figure 4A:
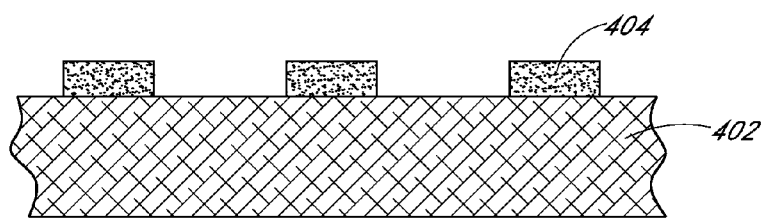
FIG. 4A illustrates a cross-sectional view of a stage in the fabrication of a solar cell, corresponding to operation 302 of the flowchart of FIG. 3, in accordance with an embodiment of the present invention.

Referring to operation 302 of flowchart 300, and corresponding FIG. 4A, a method of fabricating a solar cell includes delivering a dopant ink composition 404 to a region above a substrate 402.

In an embodiment, the dopant ink composition 404 includes a cross-linkable matrix precursor, a bound dopant species, and a solvent. In one such embodiment, the dopant ink composition is one of or is similar to the dopant ink compositions 100A and 100B, described above. For example, in a specific such embodiment, the dopant ink composition 404 further includes a plurality of particles, and the bound dopant species is coupled to one of the particles. In an embodiment, delivering the dopant ink composition 404 to the region above the substrate 402 includes using a fluid deposition technique such as, but not limited to, ink jetting, screen printing, blading, transferring by pipette, spin coating and etching, gravure printing, or slot-die coating.

Figure 4B:
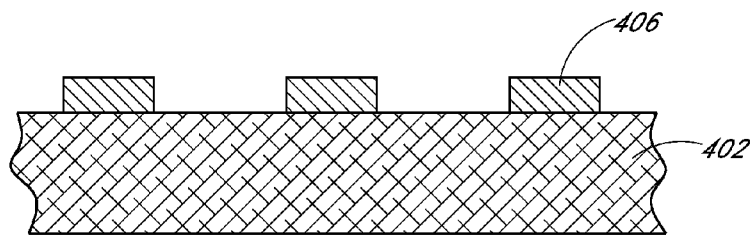
FIG. 4B illustrates a cross-sectional view of a stage in the fabrication of a solar cell, corresponding to operation 304 of the flowchart of FIG. 3, in accordance with an embodiment of the present invention.

Referring to operation 304 of flowchart 300, and corresponding FIG. 4B, the method also includes baking the dopant ink composition 404 to provide a baked dopant ink composition 406.

In an embodiment, baking the dopant ink composition 404 removes a substantial portion of a solvent of the dopant ink composition 404. In one such embodiment, the solvent is one such as or similar to the solvents described in association with solvents 106A and 106B above. In an embodiment, baking the dopant ink composition 404 includes heating to a temperature approximately in the range of 100-400 degrees Celsius.

Figure 4C:
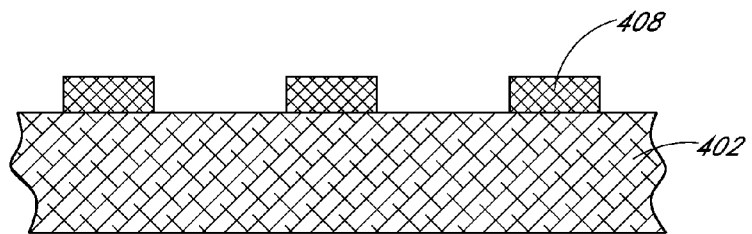
FIG. 4C illustrates a cross-sectional view of a stage in the fabrication of a solar cell, corresponding to operation 306 of the flowchart of FIG. 3, in accordance with an embodiment of the present invention.

Referring to operation 306 of flowchart 300, and corresponding FIG. 4C, the method also includes curing the baked dopant ink composition 406 to provide a cured dopant ink composition 408.

In an embodiment, curing the baked dopant ink composition 406 cross-links a substantial portion of a cross-linkable matrix precursor of the dopant ink composition 404. In one such embodiment, the cross-linkable matrix precursor is one such as or similar to the cross-linkable matrix precursors 102A and 102B above. In an embodiment, curing the baked dopant ink composition 406 includes heating to a temperature approximately in the range of 350-900 degrees Celsius. In an embodiment, the baking of operation 304 and the curing of operation 306 are performed in the same process operation.

Figure 4D:
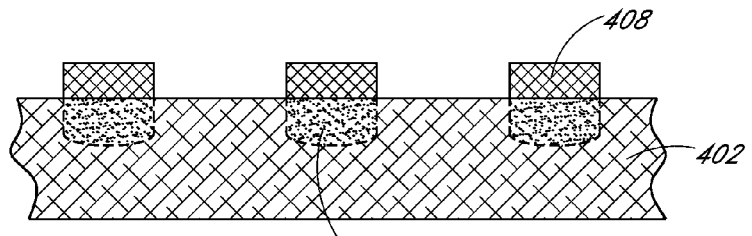
FIG. 4D illustrates a cross-sectional view of a stage in the fabrication of a solar cell, corresponding to operation 308 of the flowchart of FIG. 3, in accordance with an embodiment of the present invention.

Referring to operation 308 of flowchart 300, and corresponding FIG. 4D, the method also includes driving dopants from the cured dopant ink composition 408 toward the substrate 402.

In an embodiment, driving dopants from the cured dopant ink composition 408 includes driving dopant impurity atoms into the substrate 402 to form doped regions 410, e.g., n-type or p-type doped regions, in the substrate 402. Thus, in an embodiment, the region of the substrate 402 is an upper surface of the substrate 402, and driving dopants from the cured dopant ink composition 408 toward the substrate 402 includes driving dopants into the substrate 402. In one such embodiment, the driving includes both migrating and incorporating the dopant impurity atoms into regions 410 of the substrate 402. In an embodiment, driving dopants from the cured dopant ink composition 408 includes heating to a temperature approximately in the range of 850-1050 degrees Celsius. In an embodiment, the remaining components of the cured dopant ink composition 408 are removed subsequent to the driving, e.g., by a wet etch process.

In an embodiment, substrate 402 is a bulk silicon substrate, e.g., a bulk n-type silicon substrate. In one such embodiment, the dopant impurity atoms are p-type for silicon (such as boron impurity atoms) or are n-type for silicon (such as phosphorus impurity atoms).

Figure 5A:
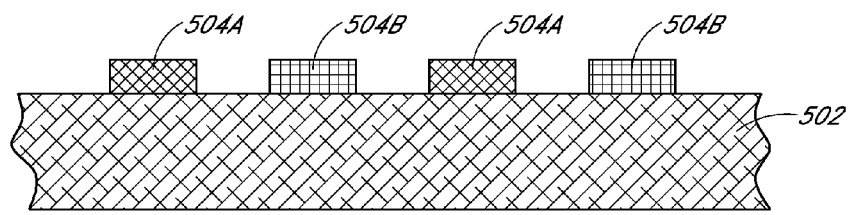
FIGS. 5A and 5B illustrate cross-sectional views of various stages in the fabrication of a solar cell, in accordance with another embodiment of the present invention.
Figure 5B:
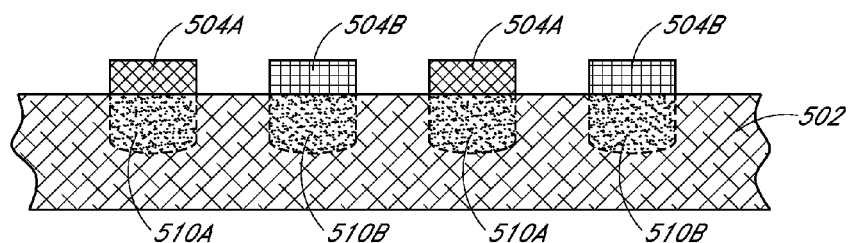

FIGS. 5A and 5B illustrate cross-sectional views of various stages in the fabrication of a solar cell, in accordance with another embodiment of the present invention. Referring to the operations of flowchart 300, in an embodiment, the dopant ink composition 404 is a first dopant ink composition for a first conductivity type and the method further includes delivering a second dopant ink composition for a second, different, conductivity type to a second region above the substrate 402. As an example, FIG. 5A depicts a first dopant ink composition 504A for a first conductivity type and a second dopant ink composition 504B for a second, different, conductivity type disposed above a substrate 502. As shown, both the first dopant ink composition 504A and the second dopant ink composition 504B have been baked and cured.

Referring to FIG. 5B, dopants are driven from the cured first dopant ink composition 504A and the cured second dopant ink composition 504B toward the substrate 502. In an embodiment, driving dopants from cured dopant ink compositions includes driving dopant impurity atoms into the substrate 502 to form doped regions 510A and 510B, e.g., n-type doped regions 510A and p-type doped regions 510B or alternatively p-type doped regions 510A and n-type doped regions 510B, in the substrate 502.

In an embodiment, the second dopant ink composition 504B is delivered prior to baking the first dopant ink composition 504A. In one such embodiment, the first dopant ink composition 504A and the second dopant ink composition 504B are delivered sequentially. In another such embodiment, the first dopant ink composition 504A and the second dopant ink composition 504B are delivered substantially simultaneously.

In another embodiment, however, the second dopant ink composition 504B is delivered subsequent to baking but prior to curing the first dopant ink composition 504A. The second dopant ink composition 504B is then independently baked, while curing and driving the dopants from the first and second dopant ink compositions is performed in the same sets of process operations, respectively. In yet another embodiment, the second dopant ink composition 504B is delivered subsequent to baking and curing, but prior to driving dopants from, the first dopant ink composition 504A. The second dopant ink composition 504B is then independently baked and cured, while driving the dopants from the first and second dopant ink compositions is performed in the same process operation. In an alternative embodiment, all of baking, curing and driving dopants from the second dopant ink composition 504B is done independently from baking, curing and driving dopants from the first dopant ink composition 504A.

Figure 6A:
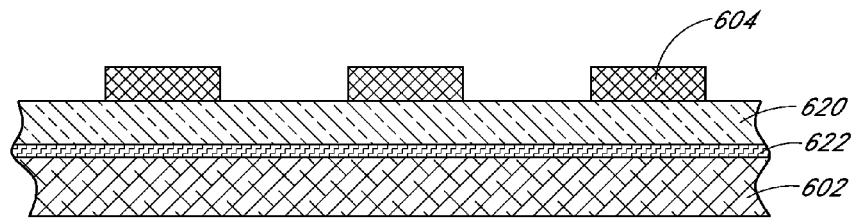
FIGS. 6A and 6B illustrate cross-sectional views of various stages in the fabrication of a solar cell, in accordance with another embodiment of the present invention.
Figure 6B:
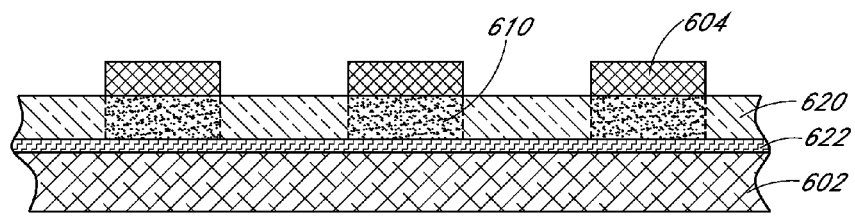

FIGS. 6A and 6B illustrate cross-sectional views of various stages in the fabrication of a solar cell, in accordance with another embodiment of the present invention. Referring to the operations of flowchart 300, in an embodiment, the dopant ink composition 404 is formed on an upper surface of a semiconductor layer disposed above the substrate 402. As an example, FIG. 6A depicts a dopant ink composition 604 disposed above a semiconductor layer 620 disposed above a substrate 602. In one embodiment, a thin dielectric layer 622 is disposed between the semiconductor layer 620 and the substrate 602, as depicted in FIG. 6A.

Referring to FIG. 6B, driving dopants from the dopant ink composition 604 (e.g., from a cured form of a dopant ink composition) toward the substrate 602 involves driving dopants into the semiconductor layer 620. In an embodiment, driving dopants from the dopant ink composition 604 includes driving dopant impurity atoms into the semiconductor layer 620 to form doped regions 610, e.g., n-type or p-type doped regions, in the semiconductor layer 620.

In an embodiment, semiconductor layer 620 is an amorphous or polycrystalline silicon layer. In one such embodiment, the dopant impurity atoms are p-type for silicon (such as boron impurity atoms) or are n-type for silicon (such as phosphorus impurity atoms). In a specific such embodiment, substrate 602 is a bulk silicon substrate, e.g., a bulk n-type silicon substrate, and thin dielectric layer 622 is a silicon oxide or silicon dioxide layer.

Thus, dopant ink compositions and methods of fabricating solar cells there from have been disclosed. In accordance with an embodiment of the present invention, a dopant ink composition includes a cross-linkable matrix precursor, a bound dopant species, and a solvent. In one embodiment, the bound dopant species is bound to the cross-linkable matrix precursor. In one embodiment, the dopant ink composition further includes a plurality of particles, and the bound dopant species is bound to one or more of the particles. In accordance with another embodiment of the present invention, a method of fabricating a solar cell includes delivering a dopant ink composition to a region above a substrate. The dopant ink composition includes a cross-linkable matrix precursor, a bound dopant species, and a solvent. The method also includes baking the dopant ink composition to remove a substantial portion of the solvent of the dopant ink composition, curing the baked dopant ink composition to cross-link a substantial portion of the cross-linkable matrix precursor of the dopant ink composition, and driving dopants from the cured dopant ink composition toward the substrate.

What is claimed is:

1. A dopant ink composition, comprising:
   a solvent;
   a cross-linkable matrix precursor comprising siloxane monomers dispersed in the solvent, one or more of the siloxane monomers bound to a dopant species through a chemical bond; and
   silicon nanoparticles or silicon oxide nanoparticles.

2. The dopant ink composition of claim 1, wherein the dopant species is an n-type dopant precursor.

3. The dopant ink composition of claim 2, wherein the n-type dopant precursor is selected from the group consisting of a phosphine moiety and an organophosphine moiety.

4. The dopant ink composition of claim 1, wherein the solvent is selected from the group consisting of an alkyl-based alcohol, an aryl-based alcohol, decalin, an alkane, an aromatic, an ethyl acetate species, and water, and wherein the cross-linkable matrix precursor is dissolved in the solvent.

5. The dopant ink composition of claim 1, wherein the chemical bond is selected from the group consisting of a covalent bond, an ionic bond, and a dative bond.

6. The dopant ink composition of claim 1, wherein the dopant species is a p-type dopant precursor.

7. The dopant ink composition of claim 6, wherein the p-type dopant precursor is selected from the group consisting of a borane moiety and an organoborane moiety.

* * * * *